(12) United States Patent
Kim

(10) Patent No.: US 9,859,520 B2
(45) Date of Patent: Jan. 2, 2018

(54) ORGANIC LIGHT-EMITTING DISPLAY DEVICE AND METHOD OF MANUFACTURING THE SAME

(71) Applicant: LG Display Co., Ltd., Seoul (KR)

(72) Inventor: KyungMan Kim, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/725,014

(22) Filed: May 29, 2015

(65) Prior Publication Data

US 2016/0149155 A1 May 26, 2016

(30) Foreign Application Priority Data

Nov. 25, 2014 (KR) .......................... 10-2014-0165688

(51) Int. Cl.
*H01L 51/52* (2006.01)
*H01L 27/32* (2006.01)

(52) U.S. Cl.
CPC ...... *H01L 51/5228* (2013.01); *H01L 27/3246* (2013.01); *H01L 27/3258* (2013.01); *H01L 27/3276* (2013.01)

(58) Field of Classification Search
CPC combination set(s) only.
See application file for complete search history.

(56) References Cited

U.S. PATENT DOCUMENTS

| | | |
|---|---|---|
| 2005/0073243 A1 | 4/2005 | Yamazaki et al. |
| 2009/0153046 A1* | 6/2009 | Hayashi ............. H01L 27/3276 313/505 |
| 2013/0126842 A1* | 5/2013 | Takeuchi ............ H01L 27/3246 257/40 |
| 2013/0256638 A1* | 10/2013 | Uesugi ............... H01L 51/5228 257/40 |
| 2013/0260497 A1* | 10/2013 | Ahn .................. H01L 29/66969 438/34 |

(Continued)

OTHER PUBLICATIONS

Extended European Search Report issued in the corresponding European Patent Application No. 15172515.7 dated Mar. 30, 2016.

*Primary Examiner* — Kyoung Lee
*Assistant Examiner* — Ratisha Mehta
(74) *Attorney, Agent, or Firm* — Morgan, Lewis & Bockius LLP

(57) ABSTRACT

Provided are an organic light-emitting display device and method of manufacturing the same. An organic light-emitting display device includes: a thin-film transistor on a substrate, an auxiliary electrode member in a contact area on the substrate, the auxiliary electrode member being spaced apart from the thin-film transistor, an insulating member on the thin-film transistor and the auxiliary electrode member, the insulating member including an opening through which at least a part of the auxiliary electrode member is exposed in the contact area, and an organic light-emitting element on the insulating member, the organic light-emitting element including: an anode, an organic light-emitting layer, and a cathode, wherein a side surface of the opening is disposed closer to the inside of the opening than a side surface of the auxiliary electrode member, such that the cathode is in contact with the auxiliary electrode member without a reverse-tapered partitioning wall thereover.

17 Claims, 12 Drawing Sheets

(56) References Cited

U.S. PATENT DOCUMENTS

2014/0027724 A1* 1/2014 Lim .................... H01L 51/5281
                                                    257/40
2016/0035813 A1* 2/2016 Lee .................... H01L 27/3276
                                                    257/40

* cited by examiner

ORGANIC LIGHT-EMITTING DISPLAY DEVICE AND METHOD OF MANUFACTURING THE SAME

CROSS-REFERENCE TO RELATED APPLICATION(S)

This application claims the benefit and priority of Korean Patent Application No. 10-2014-0165688, filed on Nov. 25, 2014, the entire disclosure of which is hereby incorporated by reference herein for all purposes.

BACKGROUND

1. Technical Field

The present disclosure relates to an organic light-emitting display device and a method of manufacturing the same, and more particularly, to an organic light-emitting display device with uniform luminance throughout the screen as well as improved production yield, and a method of manufacturing the same.

2. Discussion of the Related Art

An organic light-emitting display device, unlike a liquid crystal display (LCD) device, is self-luminous. Accordingly, an organic light-emitting display device does not require an additional light source; thus, it can be made lighter and thinner. Further, an organic light-emitting display device has advantages in that it is driven with a low voltage to consume less power, and in that it has a shorter response time, wider viewing angle, and good contrast ratio (CR). For these reasons, an organic light-emitting display device is currently being developed as a next generation display device.

For a top-emission organic light-emitting display device, a transparent electrode or a transflective electrode is employed as the upper electrode (e.g., a cathode) to emit light generated in the organic light-emitting layer upward through the upper electrode. When a transparent electrode or a transflective electrode is employed as the cathode, the cathode is made thin in order to improve transmissivity. The thinner the cathode is, however, the higher the electric resistance of the cathode. Additionally, as the distance between an organic light-emitting element and a voltage supplying pad increases in a large organic light-emitting display device, a voltage drop (e.g., IR-drop) may occur beyond the normal level, causing the luminance to be non-uniform in the organic light-emitting display device. As used herein, the term "voltage drop" refers to a decrease in the potential difference in the organic light-emitting element, specifically, between an anode and a cathode in an organic light-emitting display device.

SUMMARY

Accordingly, the present disclosure is directed to an organic light-emitting display device and method of manufacturing the same that substantially obviate one or more of the problems due to limitations and disadvantages of the related art.

An object of the present disclosure is to provide an organic light-emitting display device that addresses the problem of non-uniform luminance caused by a voltage drop, by configuring auxiliary electrodes in an eaves structure using a layer made of the same material as a gate electrode of a thin-film transistor, a layer made of the same material as source electrode/drain electrode of the thin-film transistor, and a passivation layer.

Another object of the present disclosure is to provide an organic light-emitting display device with improved productivity by configuring auxiliary electrodes in an eaves structure without undergoing an additional process of forming a partitioning wall.

Additional features and advantages will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided an organic light-emitting display device, including: a thin-film transistor on a substrate, an auxiliary electrode member in a contact area on the substrate, the auxiliary electrode member being spaced apart from the thin-film transistor, an insulating member on the thin-film transistor and the auxiliary electrode member, the insulating member including an opening through which at least a part of the auxiliary electrode member is exposed in the contact area, and an organic light-emitting element on the insulating member, the organic light-emitting element including: an anode, an organic light-emitting layer, and a cathode, wherein a side surface of the opening is disposed closer to the inside of the opening than a side surface of the auxiliary electrode member, such that the cathode is in contact with the auxiliary electrode member without a reverse-tapered partitioning wall thereover.

In another aspect, there is provided an organic light-emitting display device, including: a thin-film transistor on a substrate, the thin-film transistor including: a gate electrode, an active layer, a source electrode, and a drain electrode, a first auxiliary electrode spaced apart from the gate electrode, the first auxiliary electrode including an exposed top surface in a contact area on the substrate, a second auxiliary electrode on the first auxiliary electrode, the second auxiliary electrode including an exposed side surface in the contact area, a passivation layer on the second auxiliary electrode, the passivation layer including an exposed bottom surface in the contact area, an anode electrically connected to the thin-film transistor, an organic light-emitting layer on the anode, and a cathode on the organic light-emitting layer, wherein the cathode is in contact with the exposed top surface of the first auxiliary electrode or the exposed side surface of the second auxiliary electrode in the contact area.

In another aspect, there is provided a method of manufacturing an organic light-emitting display device, the method including: providing a gate electrode and a first auxiliary electrode spaced apart from each other on a substrate, providing a second auxiliary electrode in contact with the first auxiliary electrode, a source electrode, and a drain electrode separated from the gate electrode, providing a passivation layer over the source electrode, the drain electrode, and a top surface of the second auxiliary electrode, removing a part of the passivation layer and a part of the second auxiliary electrode, such that a side surface of the second auxiliary electrode and a part of a top surface of the first auxiliary electrode are exposed in a contact area, providing an anode electrically connected to the source electrode or drain electrode, providing an organic light-emitting layer on the anode, and providing a cathode on the organic light-emitting layer, such that the cathode comes in contact with the exposed part of the top surface of the first auxiliary electrode or the exposed side surface of the second auxiliary electrode in the contact area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
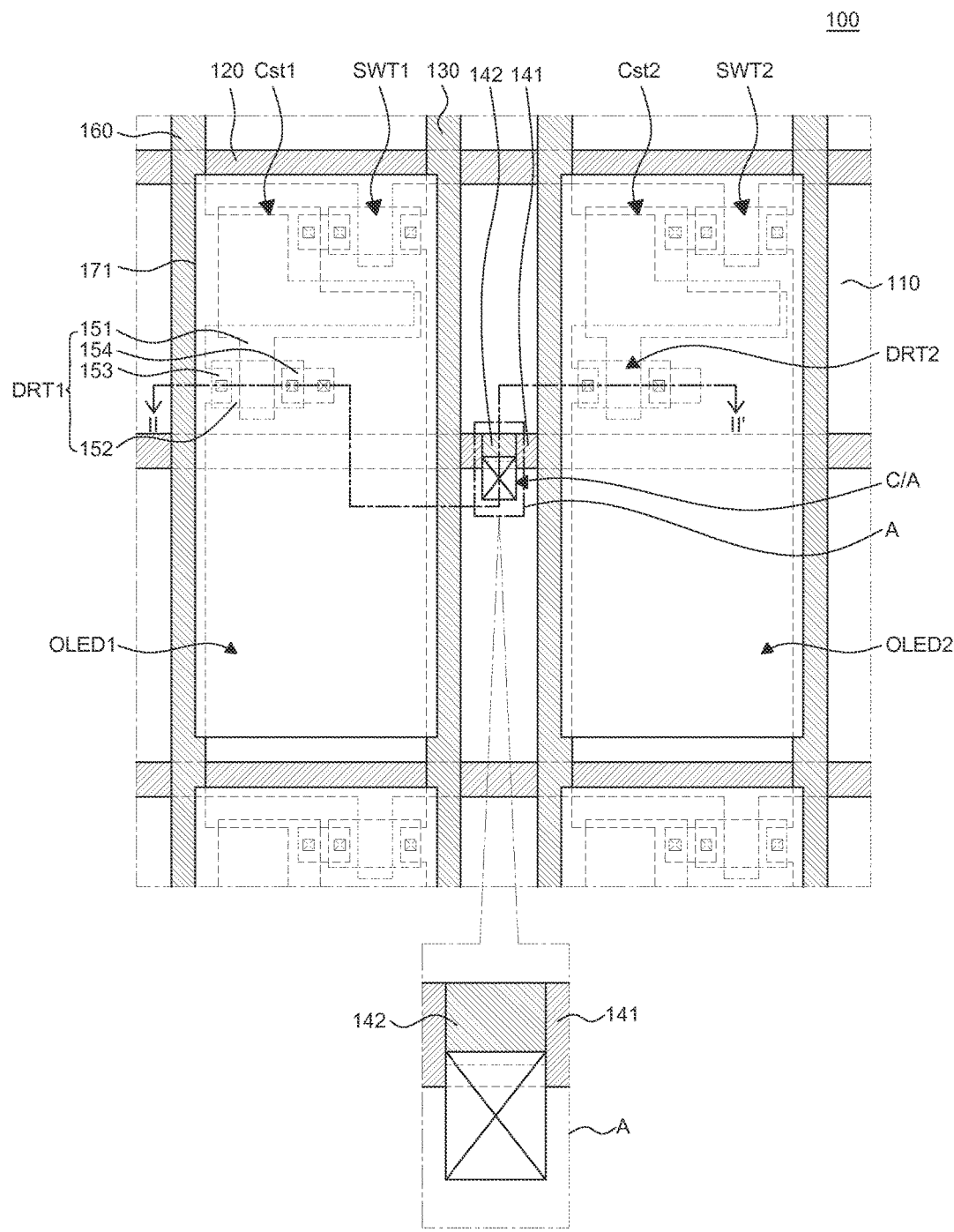
FIG. 1 is a schematic plan view for illustrating an organic light-emitting display device according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

In order to improve the above-mentioned problem of a non-uniform luminance caused by voltage drop, an auxiliary electrode may be used. To electrically connect an auxiliary electrode to a cathode, a partitioning wall may be used.

When using a partitioning wall, a cathode may be connected to a top surface of an auxiliary electrode exposed between a side surface of the partitioning wall and a side surface of a bank. The cathode may be connected to the top surface of the auxiliary electrode due to the difference in step coverage between the material of the cathode and that of the organic light-emitting layer. For example, the bank may have a tapered shape while the partitioning wall may have a reverse-tapered shape. As used herein, a "tapered" shape refers to a shape of an element whose the cross-sectional area becomes smaller as the element move away from a substrate. That is, the cross-sectional area of the bank may become smaller as it moves away from the substrate, while the cross-sectional area of the partitioning wall may become larger as it moves away from the substrate. As the partitioning wall may have a reverse-tapered shape, a shadow area may be made on a part of the top surface of the auxiliary electrode under the partitioning wall.

Incidentally, the organic light-emitting layer may be formed in a manner in which an organic material may be deposited on the substrate. As described above, an organic material has a low step coverage, and it is not deposited on the top surface of the auxiliary electrode in the shadow area made by the reverse-tapered shape of the partitioning wall. That is, the organic material for forming the organic light-emitting layer is deposited on the top surface of the bank and the top surface of the partitioning wall, but is not deposited on the sloped side surface of the partitioning wall in the reverse-tapered shape and the top surface of the auxiliary electrode in the shadow area formed by the reverse-tapered shape. Accordingly, the organic material is disconnected between the bank and the partitioning wall by means of the reverse-tapered shape. As a result, a physical space where the cathode comes in contact with the top surface of the auxiliary electrode can be obtained.

On the other hand, the cathode is made of a material having a high step coverage, and thus it can be deposited continuously along the top surface and side surface of the bank and the top surface and side surface of the partitioning wall. Accordingly, the cathode is connected to the top surface of the auxiliary electrode where the organic material is not deposited.

However, the above-mentioned procedure requires an additional process of forming the partitioning wall, so that manufacturing cost and processing time of organic light-emitting display devices are increased, which would ultimately reduce productivity of the organic light-emitting display devices.

In addition, if a negative photoresist is used for forming the partitioning wall, serious problems such as damage to substrates may be caused during a repair process of the negative photoresist. More specifically, the negative photoresist may be removed by development, leaving the exposed part. Then, the exposed part is hardened. In doing so, if the negative photoresist fails to be formed in a desired shape due to processing problems such as exposure failure, the need to repair the negative photoresist for removing the failed negative photoresist from the substrate, and the need to applying a new negative photoresist onto the substrate. The newly applied negative photoresist would have to be developed again. Unfortunately, the substrate may be damaged while removing the hardened negative photoresist from the substrate. If the substrate is seriously damaged, the substrate itself has to be discarded, along with the thin-film transistors formed on the substrate. As a result, manufacturing cost of organic light-emitting display devices is increased and production yield is lowered.

In view of this, embodiments may replace the reverse-tapered partitioning wall structure without using a negative photoresist. As a result, embodiments include an organic light-emitting display device that can replace the reverse-tapered partitioning wall during processes of forming thin-film transistors and a passivation layer without undergoing any additional process for forming a partitioning wall.

Hereinafter, embodiments will be described in detail with reference to the accompanying drawings.

Figure 2:
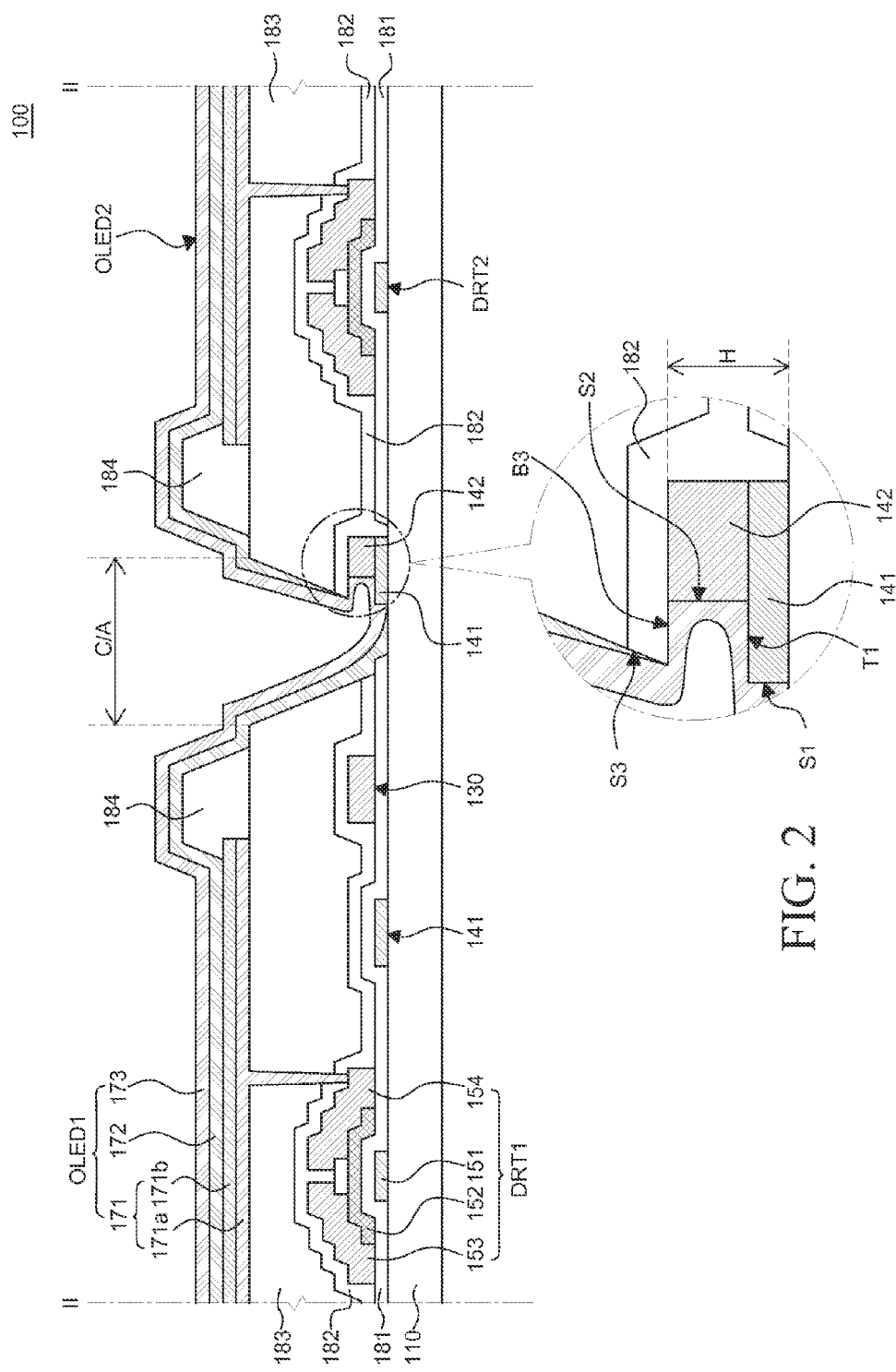
FIG. 2 is a schematic cross-sectional view taken along line II-II' of FIG. 1.

FIG. 1 is a schematic plan view for illustrating an organic light-emitting display device according to an embodiment. FIG. 2 is a schematic cross-sectional view taken along line II-II' of FIG. 1. With reference to FIGS. 1 and 2, an organic light-emitting display device 100 may include a substrate 110, thin-film transistors, a first auxiliary electrode 141, a second auxiliary electrode 142, a passivation layer 182, an anode 171, an organic light-emitting layer 172, and a cathode 173. For convenience of illustration, FIG. 1 shows only two sub-pixels, each of which has a 2T1C structure, e.g., two thin-film transistors and one capacitor. However, the sub-pixels of embodiments are not limited to these structures, and may have other structures, such as, e.g., a 3T1C structure or a 4T2C structure. In the FIG. 1 illustration, the organic light-emitting layer 172 and the cathode 173 are not shown (they are shown in FIG. 2), and the thickness and shape of the lines are schematically shown.

The organic light-emitting display device 100 according to an embodiment may be a top-emission type in which light generated from the organic light-emitting layer 172 may be emitted upward from the substrate 100. With reference to FIG. 2, in the top-emission organic light-emitting display device 100, the anode 171 may include a reflective layer 171a, and the light generated from the organic light-emitting layer 172 may pass through the cathode 173 to be emitted.

The substrate 110 may support a variety of elements in the organic light-emitting display device 100, and may be, e.g., a glass substrate or a plastic substrate.

Data lines 130 and gate lines 120 may intersect each other on the substrate 110. Areas defined by the data lines 130 and the gate line 120 intersecting each other may be referred to as "pixel areas" or "display areas." The sub-pixels may be disposed in the areas defined by the data lines 130 and the gate line 120 intersecting each other. FIG. 1 shows a first sub-pixel and a second sub-pixel. Although the data lines 130 and the gate lines 120 are illustrated to have a straight-line shape in FIG. 1, embodiments are not limited thereto. For example, they may have a curved shape or a zigzag shape. Each of the data lines 130 may deliver a data signal to one or more sub-pixels. Each of the gate lines 120 may deliver a gate signal to one or more sub-pixels.

A power supply (VDD) line 160 may be electrically separated from the data lines 130 and the gate lines 120, and may apply a supply voltage VDD to the sub-pixels.

The first sub-pixel may include a first switching thin-film transistor SWT1, a first driving transistor DRT1, a first storage capacitor Cst1, and a first organic light-emitting element OLED1. The second sub-pixel may include a second switching thin-film transistor SWT2, a second driving transistor DRT2, a second storage capacitor Cst2, and a second organic light-emitting element OLED2. The first and second sub-pixels may be substantially identical to one another, except for their locations, and therefore, descriptions will be made mainly with respect to the first sub-pixel for convenience.

Each of the first switching thin-film transistor SWT1 and the first driving thin-film transistor DRT1 may include a gate electrode, a source electrode, and a drain electrode, and each may be either a p-type thin-film transistor or an n-type thin-film transistor. Although a p-type thin-film transistor is shown in the FIG. 1 example, this is merely illustrative. In addition, although an inverted staggered thin-film transistor, in which the gate electrode 151 is disposed under an active layer 152, is shown in the FIG. 2 example, a coplanar thin-film transistor may also be employed, as an example.

The first switching thin-film transistor SWT1 may be connected to a gate line 120, a data line 130, the first storage capacitor Cst1, and the first driving thin-film transistor DRT1. The first driving thin-film transistor DRT1 may be connected to the VDD line 160, the first storage capacitor Cst1, the first switching thin-film transistor SWT1, and an anode 171 of the first organic light-emitting element OLED1. The first storage capacitor Cst1 may be connected to the first switching thin-film transistor SWT1, the first driving thin-film transistor DRT1, and the VDD line 160.

With reference to FIG. 2, the gate electrode 151 may be disposed on the substrate 110 below the anode 171. The gate electrode 151 may be disposed under the active layer 152, and may function as an electrode for forming a channel in the active layer 152. The gate electrode 151 may be made of a conductive material, and may be a single layer or multiple layers.

A gate insulating layer 181 may be disposed on the gate electrode 151. The gate insulating layer 181 may insulate the gate electrode 151 from the active layer 152, and may be made of, but is not limited to, silicon oxide ($SiO_x$), silicon nitride ($SiN_x$), or layers thereof.

The active layer 152 may be disposed on the gate insulating layer 181 and over the gate electrode 151. The active layer 152 may include a channel region in which a channel is formed, a source region connected to the source electrode 153, and a drain region connected to the drain electrode 154.

The source electrode 153 and the drain electrode 154 may be disposed on the active layer 152, and may be electrically connected to the active layer 152. For example, the source electrode 153 and the drain electrode 154 may be in contact with the source region and drain region of the active layer 152, respectively. In some embodiments, additional contact members may be disposed between the source electrode 153 and the active layer 152 and between the drain electrode 154 and the active layer 152. The source electrode 153 and the drain electrode 154 may be connected to the source region and the drain region of active layer 152 via the contact members, respectively. Each of the source electrode 153 and the drain electrode 154 may be made of a conductive material, and may be a single layer or multiple layers.

With reference to FIGS. 1 and 2, the first auxiliary electrode 141 may be electrically disconnected from the gate line 120, the data line 130, and the VDD line 160. The first auxiliary electrode 141 may be electrically connected to the cathode 173 in a contact area C/A, and may be made of a conductive material to reduce voltage drop across the resistance of the cathode 173. The resistance of the first auxiliary electrode 141 may be calculated based on the width, the length, the thickness, and the type of the material of the first auxiliary electrode 141.

The first auxiliary electrode 141, also referred to as an "auxiliary line," may be electrically connected to a voltage supplying pad (not shown) disposed on an outer peripheral region of the substrate 110. The first auxiliary electrode 141 may receive a ground voltage or a negative (or low) voltage VSS via the voltage supplying pad. In addition, the voltage supplying pad may be electrically connected to the cathode 173, as well. The same voltage VSS may be applied to the cathode 173 and the first auxiliary electrode 141.

The first auxiliary electrode 141 may reduce the resistance of the cathode 173 to which it is connected. By reducing the resistance of the cathode 173, it may be possible to mitigate the voltage drop, e.g., to decrease the potential difference between the anode 171 and the cathode 173 in a large display device. In order to mitigate the voltage drop in a large display device, the width and thickness of the first auxiliary electrode 141 may be determined appropriately based on the size of the organic light-emitting display device.

With reference to FIG. 2, the first auxiliary electrode 141 may be disposed on the same plane on which the gate electrode 151 of the first driving thin-film transistor DRT1 and the gate electrode of the second driving thin-film transistor DRT2 are disposed, and the first auxiliary electrode 141 may be separated from the gate electrode 151. The first auxiliary electrode 141 may be made of a metal, such as, e.g., chromium (Cr), titanium (Ti), molybdenum-titanium (Mo—Ti) alloy, etc., or may be a transparent conductive oxide (TCO), such as, e.g., indium tin oxide (ITO), indium zinc oxide (IZO), indium tin zinc oxide (ITZO), zinc oxide, tin oxide, etc. If the first auxiliary electrode 141 is made of the same material as that of the gate electrode 151 of the first driving thin-film transistor DRT1 and the gate electrode of the second driving thin-film transistor DRT2, then the first auxiliary electrode 141, the gate electrode 151 of the first driving thin-film transistor DRT1, and the gate electrode of the second driving thin-film transistor DRT2 may be produced during a same process simultaneously.

In the contact area C/A, a second auxiliary electrode 142 may be disposed on the first auxiliary electrode 141. As shown in the FIG. 1 example, the contact area C/A may be formed between a pixel region of the first sub-pixel and a pixel region of the second sub-pixel.

The second auxiliary electrode 142 may be electrically separated from the source electrode 153 or the drain electrode 154, and may be made of the same material as that of the source electrode 153 or the drain electrode 154. For example, the second auxiliary electrode 142 may be made of copper (Cu) or aluminum (Al).

In the contact area C/A, the second auxiliary electrode 142 may be disposed closer to the inside than the first auxiliary electrode 141. In other words, as shown in the FIG. 2 example, a side surface S1 of the first auxiliary electrode 141 may protrude more than a side surface S2 of the second auxiliary electrode 142. Accordingly, in the contact area C/A, a part of a top surface T1 of the first auxiliary electrode 141 may be exposed.

The etching selectivity of the first auxiliary electrode 141 may be lower than the etching selectivity of the second auxiliary electrode 142 with respect to the same etchant. That is, with respect to an etchant for etching the second auxiliary electrode 142, the first auxiliary electrode 141 may be made of a material having a lower etching selectivity than the etching selectivity of the second auxiliary electrode 142. More specifically, if the etching selectivity of the first auxiliary electrode 141 is lower than the etching selectivity of the second auxiliary electrode 142 with respect to an etchant for etching the second auxiliary electrode 142, the second auxiliary electrode 142 may be etched faster than the first auxiliary electrode 141. Accordingly, the side surface S2 of the second auxiliary electrode 142 may be formed closer to the inside of the first auxiliary electrode 141 than the side surface S1 of the first auxiliary electrode 141. In other words, the side surface S1 of the first auxiliary electrode 141 may protrude more than the side surface S2 of the second auxiliary electrode 142. For example, if the first auxiliary electrode 141 is made of molybdenum-titanium (Mo—Ti) alloy and the second auxiliary electrode 142 is made of copper (Cu), then the second auxiliary electrode 142 may be etched faster than the first auxiliary electrode 141 with respect to an etchant for etching copper.

The passivation layer 182 may cover the first driving thin-film transistor DRT1, the second driving thin-film transistor DRT2, the first auxiliary electrode 141, the second auxiliary electrode 142, and the data line 130. The passivation layer 182 may have contact holes through which the drain electrode of the first driving thin-film transistor DRT1 and the drain electrode of the second driving thin-film transistor DRT2 may be exposed, respectively. In addition, the passivation layer 182 may have an opening through which the side surface S2 of the second auxiliary electrode 142 and the top surface T1 of the first auxiliary electrode 141 are exposed in the contact area C/A. In some embodiments, the side surface S1 of the first auxiliary electrode 141 and a part of the top surface of the substrate 110 may be exposed via the opening of the passivation layer 182.

The passivation layer 182 may have a bottom surface B3 exposed in the contact area C/A. The side surface S3 of the passivation layer 182 may protrude more than the side surface S2 of the second auxiliary electrode 142. In other words, the side surface S3 of the opening of the passivation layer 182 may be disposed closer to the inside of the opening than the side surface S2 of the second auxiliary electrode 142. Also, the side surface S1 of the first auxiliary electrode 141 may be disposed closer to the inside of the opening than the side surface S2 of the second auxiliary electrode 142. The bottom surface B3 of the passivation layer 182 may be exposed in the contact area C/A. That is, the side surface S2 of the second auxiliary electrode 142 may be disposed closer to the inside of the passivation layer 182 than the side surface S3 of the opening. As shown in the FIG. 2 example, the portion of the passivation layer 182 in the contact area C/A may have a roof-like shape covering the second auxiliary electrode 142. That is, the side surface S3 and the bottom surface B3 of the passivation layer 182 protruding more than the side surface S2 of the second auxiliary electrode 142 look like the eaves of a roof. For convenience of description, the structure of the first auxiliary electrode 141, the second auxiliary electrode 142, and the passivation layer 182 in the contact area C/A shown in the FIG. 2 example is referred to herein as an "eaves structure" or an "eaves shape."

The height H of the eaves structure, i.e., the distance from the bottom surface of the first auxiliary electrode 141 to the exposed bottom surface B3 of the passivation layer 182 or the sum of the thickness of the first auxiliary electrode 141 and the thickness of the second auxiliary electrode 142, may be greater than the thickness of the organic light-emitting layer 172. For example, the distance from the bottom surface of the first auxiliary electrode 141 to the bottom surface B3 of the passivation layer 182 may be equal to or greater than approximately 4,000 Å. In one example, because the height H of the eaves structure may be greater than the organic light-emitting layer 172, a physical space where the cathode 173 is in contact with the first auxiliary electrode 141 or the second auxiliary electrode 142 may be obtained. In this regard, the thickness of the organic light-emitting layer 172 may be defined as the distance from the top surface of the anode 171 to the bottom surface of the cathode 173. That is, the thickness of the organic light-emitting layer 172 refers to the overall distance (or thickness) between the anode 172 and the cathode 173.

A planarization layer 183 may be disposed on the passivation layer 182. The planarization layer 183 may protect the thin-film transistors and storage capacitors disposed thereunder while planarizing the area above the thin-film transistors, such that other elements may be more easily formed or disposed above the thin-film transistors. For example, as shown in the FIG. 2 illustration, the planarization layer 183 may be disposed on the passivation layer 182 to cover the first driving thin-film transistor DRT1 and the second driving thin-film transistor DRT2, and may planarize the area above the passivation layer 182. The planarization layer 183 may have such thickness that it may planarize the area over the passivation layer 182 so that the first organic light-emitting element OLED1 (including the anode 171, the organic light-emitting layer 172, and the cathode 173) and the second organic light-emitting element OLED2 may be formed thereon. The planarization layer 183 may be made of an organic insulating material. In addition, the planarization layer 183 may have contact holes through which the drain electrode 154 of the first driving thin-film transistor DRT1 and the drain electrode of the second driving thin-film transistor DRT2 may be respectively exposed. Further, the planarization layer 183 may have an opening corresponding to the contact area C/A. The side surface S3 and the bottom surface B3 of the passivation layer 182 may be exposed conforming to the opening in the planarization layer 183. The top surface T1 of the first auxiliary electrode 141 and the side surface S2 of the second auxiliary electrode 142 may be exposed under the passivation layer 182.

Although not shown in the FIG. 1 example, if the thin-film transistors are coplanar thin-film transistors, the layered structure of the first auxiliary electrode and the second auxiliary electrode may be substantially identical to the layered structure of the first auxiliary electrode 141 and the second auxiliary electrode 142 shown in FIG. 1. For example, the first auxiliary electrode may be disposed on the gate insulating layer, the second auxiliary electrode may be disposed on the first auxiliary electrode, and the passivation layer may be disposed on the second auxiliary electrode.

As shown in FIG. 1, the anode 171 in a sub-pixel may be disconnected from an anode in another sub-pixel. As shown in the FIG. 2 example, in the first sub-pixel, the anode 171 may be electrically connected to the first driving thin-film transistor DRT1 through a contact hole passing through the planarization layer 183 and the passivation layer 182. Further, in the second sub-pixel, the anode may be electrically connected to the second driving thin-film transistor DRT2 through a contact hole passing through the planarization layer 183 and the passivation layer 182. The anode 171 in the first sub-pixel may be substantially identical to the anode in the second sub-pixel, and accordingly only the anode 171 in the first sub-pixel will be described for convenience.

The anode 171 may include the reflective layer 171a and a first transparent electrode 171b. The reflective layer 171a may reflect upward light generated from the organic light-emitting layer 172. The reflective layer 171 may be made of, e.g., silver (Ag), nickel (Ni), gold (Au), platinum (Pt), aluminum (Al), copper (Cu), and/or molybdenum/aluminum neodymium (Mo/AlNd), which have good reflectivity. The first transparent electrode 171b may inject holes into the organic light-emitting layer 173. The first transparent electrode 171b may be made of a material having a high work function for easily injecting holes. For example, the first transparent electrode 171b may be made of a transparent conductive oxide (TCO), such as ITO, IZO, ITZO, zinc oxide, and/or tin oxide.

A bank 184 may be disposed on the planarization layer 183, and may have an opening corresponding to a pixel area and the contact area C/A. That is, the bank 184 may surround the anode 171 of the first sub-pixel and the anode of the second sub-pixel, so that the top surface of the anode 171 is exposed via the opening corresponding to the pixel area. Further, the bank 184 may surround the contact area C/A, and may have an opening corresponding to the contact area C/A. The eaves structure may be exposed via the opening of the bank 184 corresponding to the contact area C/A.

The bank 184 may be made of an organic insulating material, and may have a tapered shape. The bank 184 may be made of a photoresist. The bank 184 may have such thickness that it can separate the first sub-pixel from the second sub-pixel, and may separate the pixel area of the first sub-pixel from the pixel area of the second sub-pixel adjacent to each other.

The organic light-emitting layer 172 may be disposed on the anode 171 and the bank 184. The organic light-emitting layer 172 may generate, e.g., red light, green light, blue light, or white light by recombining holes injected from the anode 171 and electrons injected from the cathode 173 in the pixel area.

In the contact area C/A, the organic light-emitting layer 172 may cover the exposed side surface of the planarization layer 183. As shown in the FIG. 2 illustration, the organic light-emitting layer 172 may cover an exposed part of the gate insulating layer 181 and a part of the top surface of the substrate 110 in the contact area C/A. However, the organic light-emitting layer 172 may not cover the exposed top surface T1 of the first auxiliary electrode 141 and the exposed side surface S2 of the second auxiliary electrode 142 in the contact area C/A. The organic light-emitting layer 172 may be disconnected where the exposed top surface T1 of the first auxiliary electrode 141 and the exposed side surface S2 of the second auxiliary electrode 142 exist.

The organic light-emitting layer 172 may be formed by depositing an organic material all over the substrate 110 so that it covers all of the anode 171, the bank 184, and the planarization layer 183. Generally, organic materials have a low step coverage. Due to the low step coverage of organic materials, an organic material may not be deposited on the exposed top surface T1 of the first auxiliary electrode 141 and the exposed side surface S2 of the second auxiliary electrode 142 in the contact area C/A. Specifically, a shadow area may be made on the top surface T1 of the first auxiliary electrode 141 by the eaves structure of the passivation layer 182, the second auxiliary electrode 142, and the first auxiliary electrode 141. Accordingly, the organic light-emitting layer may not be deposited in the shadow area due to its low step coverage. By analogy, it is easily understood by the same reason why snow does not lie under the eaves of a roof on a snowy day. As a result, between the exposed bottom surface B3 of the passivation layer 183 and the exposed top surface T1 of the first auxiliary electrode 141, a physical space can be obtained where the cathode 173 is in contact with the exposed top surface T1 of the first auxiliary electrode 141 or with the exposed side surface S2 of the second auxiliary electrode 142.

In some embodiments, the exposed top surface T1 of the first auxiliary electrode 141 may be covered by the organic light-emitting layer 172 in spite of the low step coverage of the organic material. However, as described above, because the height H (the distance from the exposed bottom surface B3 of the passivation layer 182 to the bottom surface of the first auxiliary electrode 141) is greater than the thickness of the organic light-emitting layer 172, at least a part of the side surface S2 of the second auxiliary electrode 142 can be exposed even if the exposed top surface T1 of the first auxiliary electrode 141 is covered by the organic light-emitting layer 172. Accordingly, the cathode 173 can be in contact with the exposed side surface S2 of the second auxiliary electrode 142.

The cathode 173 may be disposed on the organic light-emitting layer 172. The cathode 173 may be made of a material having a low work function because it has to inject electrons into the organic light-emitting layer 172. For example, the cathode 173 may be made of a metal material, such as silver (Ag), titanium (Ti), aluminum (Al), molybdenum (Mo), an alloy of silver (Ag) and magnesium (Mg), etc. As described above, in a top-emission organic light-emitting display device, the cathode 173 has to transmit light generated from the organic light-emitting element 172, and thus the cathode 173 has such a thin metal electrode that light can pass through it. For example, the cathode 173 may have thickness equal to or less than 1,000 Å, e.g., 200 Å.

The cathode 173 may further include a second transparent electrode for better contact with the first auxiliary electrode 141 or the second auxiliary electrode 142. For example, if the metal electrode of the cathode 173 is too thin, the metal electrode of the cathode 173 may not be formed along the eaves structure during the process of depositing it on the organic light-emitting layer 172. As a result, it may be disconnected like the organic light-emitting layer 172. To overcome this problem, the second transparent electrode made of a material having a high step coverage may be further disposed on the metal electrode. By doing so, even if a part of the metal electrode is disconnected in the eaves structure, the cathode 173 can be connected via the second transparent electrode to the first auxiliary electrode 141 or the second auxiliary electrode 142. Accordingly, the contact between the cathode 173 and the auxiliary electrodes 141 and 142 may become more secure.

The second transparent electrode of the cathode 173 may be made of, for example, a transparent conductive oxide (TCO) and may have thickness of approximately 1,000 Å or more.

Although only one contact area C/A between the first sub-pixel and the second sub-pixel is shown in the examples of FIGS. 1 and 2, the organic light-emitting display device 100 may include a plurality of contact areas. Also, cathodes can be connected to the first auxiliary electrode 141 or to the second auxiliary electrode 142 at these contact areas.

In addition, in some embodiments, the first auxiliary electrode 141 and the second auxiliary electrode 142 may be configured as a single auxiliary electrode member. In this case, a passivation layer (or an insulating member) may be disposed on the auxiliary electrode member, and may have an opening through which the side surface of the auxiliary electrode member may be exposed in the contact area. The exposed side surface of the opening of the passivation layer (or the insulating member) may be disposed closer to the inside of the opening than a side surface of the auxiliary electrode member. The side surface of the opening in the passivation layer (or the insulating member) may protrude more than the exposed side surface of the auxiliary electrode member to form the eaves structure. In this configuration, the organic light-emitting layer of the organic light-emitting element may be disconnected at the side surface of the opening in the passivation layer (or the insulating member). The cathode of the organic light-emitting element may be in contact with the exposed side surface of the auxiliary electrode member where the organic light-emitting layer may be disconnected. As described above, because the cathode 173 is a very thin metal electrode, the resistance of the cathode 173 may become greater away from the voltage supplying pad located at the outer peripheral of the substrate 110. That is, a voltage applied to the cathode of a sub-pixel near the voltage supplying pad may differ from a voltage applied to the cathode of a sub-pixel distant from the voltage supplying pad. Accordingly, because a potential difference between a voltage applied to the anode 171 and a voltage applied to the cathode 173 may become smaller away from the voltage supplying pad, non-uniform luminance caused by a voltage drop may occur.

According to an embodiment, however, the cathode 173 may receive the same voltage from the auxiliary electrode as well as from the voltage supplying pad. That is, the cathode 173 that is more distant from the voltage supplying pad can also receive the same voltage from the auxiliary electrode, and the potential difference between the voltage applied to the anode 171 and the voltage applied to the cathode 173 can be maintained constant. Accordingly, the sub-pixels of the organic light-emitting display device 100 can emit light in uniform luminance regardless of their respective locations with respect to the voltage supplying pad. As a result, non-uniform luminance of the organic light-emitting display device 100 caused by a voltage drop can be improved.

In addition, the cathode 173 and the auxiliary electrode may be connected to each other in the contact area C/A through the eaves structure of the passivation layer 182, the second auxiliary electrode 142, and the first auxiliary electrode 141, without requiring an additional partitioning wall that is made, e.g., of a non-metal material in a reverse-tapered shape. Accordingly, because no additional partitioning wall may be necessary, it may be possible to improve production yield and reduce manufacturing cost of the organic light-emitting display device 100.

Figure 3:
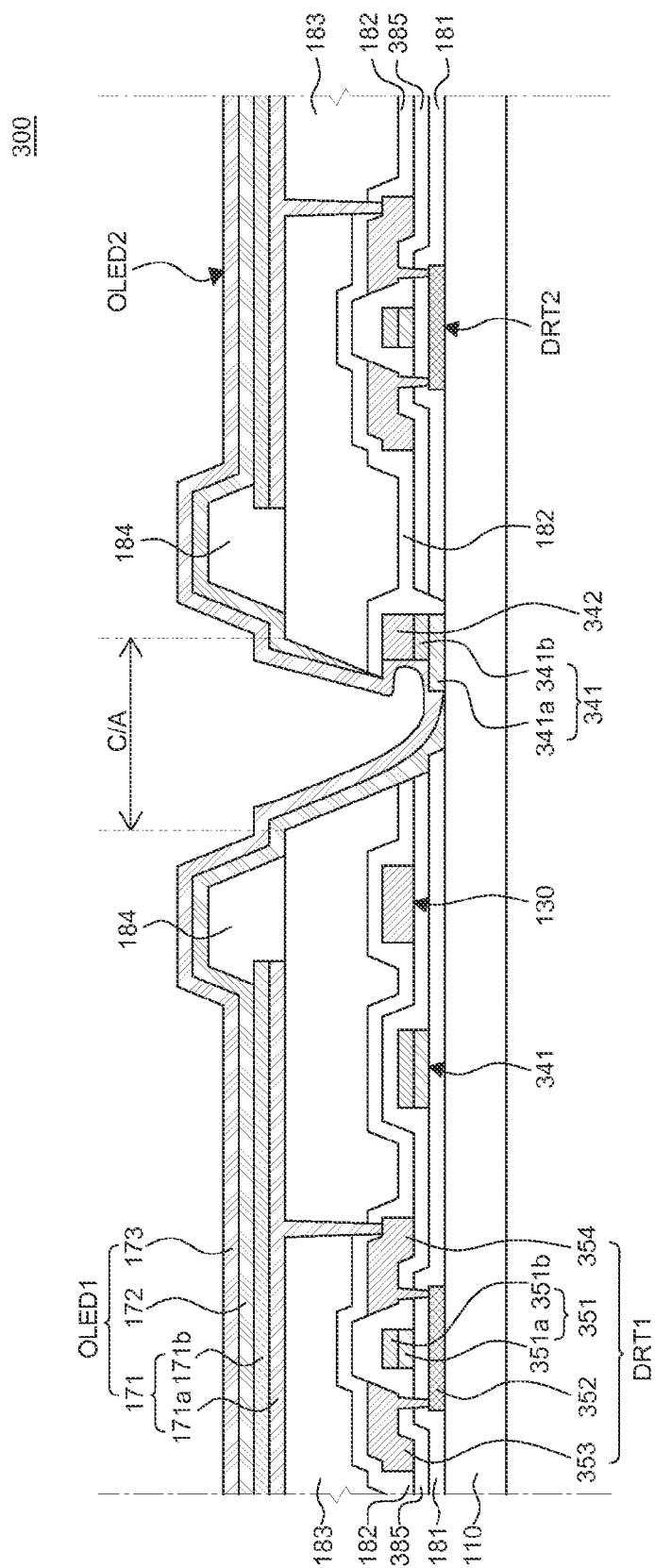
FIG. 3 is a schematic cross-sectional view for illustrating an organic light-emitting display device according to an embodiment.

FIG. 3 is a schematic cross-sectional plan view for illustrating an organic light-emitting display device according to an embodiment. The organic light-emitting display device 300 shown in FIG. 3 is substantially identical to the organic light-emitting display device 100 shown in the examples of FIGS. 1 and 2, and the redundant description will be omitted.

With reference to the FIG. 3 example, the organic light-emitting display device 300 may include a first auxiliary electrode 341 including a lower layer 341a and an upper layer 341b, and a gate electrode 351 including a lower layer 351a and an upper layer 351b. A first driving thin-film transistor DRT1 and a second driving thin-film transistor DRT2 may be coplanar thin-film transistors in which the gate electrode 351 may be disposed above an active layer 352. That is, in the first driving thin-film transistor DRT1, the active layer 352 may be disposed on the substrate 110, a gate insulating layer 181 may be disposed to cover the active layer 352, and the gate electrode 351 may be disposed on the gate insulating layer 181 over the active layer 352.

Contact holes for exposing a source region and a drain region of the active layer 352 may be formed in the gate insulating layer 181.

The gate electrode 351 may include the lower layer 351a and the upper layer 351b. Each of the lower layer 351a and the upper layer 351b may be made of a conductive material. The lower layer 351a may be made of a different conductive material from that of the upper layer 351b. For example, the lower layer 351a of the gate electrode 351 may be made of metal such as molybdenum-titanium (Mo—Ti) alloy, titanium (Ti), chrome (Cr), or a transparent conductive oxide (TCO) such as ITO, IZO and ITZO. The upper layer 351b may be made of metal such as, e.g., copper and/or aluminum.

An interlayer insulating layer 385 may be disposed over the gate electrode 351. For example, the interlayer insulating layer 385 may cover both the gate electrode 351 and the gate insulating layer 181. The interlayer insulating layer 385 may be made of, but is not limited to, silicon oxide (SiO$_x$) or silicon nitride (SiN$_x$) or layers thereof, like the gate insulating layer 181. The interlayer insulating layer 385 may have contact holes for exposing the source region and the drain region of the active layer 352.

The source electrode 353 and the drain electrode 354 may be respectively connected to the source region and the drain region of the active layer 352. The source electrode 353 and the drain electrode 354 may be respectively connected to the source region and the drain region of the active layer 352 via the contact holes passing through the interlayer insulating layer 385 and the gate insulating layer 181.

The first auxiliary electrode 341 may be made of the same material as that of the gate electrode 351. The first auxiliary electrode 341 may include a lower layer 341a and an upper layer 341b, like the gate electrode 351. The lower layer 341a of the first auxiliary electrode 341 may be made of the same conductive material as that of the lower layer 351a of the gate electrode 351. The upper layer 341b of the first auxiliary electrode 341 may be made of the same conductive material as that of the lower layer 351b of the gate electrode 351.

A top surface of the lower layer 341a of the first auxiliary electrode 341 may be exposed in the contact area C/A. In addition, a side surface of the upper layer 341b of the first auxiliary electrode 341 may be exposed in the contact area C/A. That is, as shown in the FIG. 3 example, the side surface of the lower layer 341a of the first auxiliary electrode 341 may protrude more than the side surface of upper layer 341b of the first auxiliary electrode 341. In addition, a side surface of the second auxiliary electrode 342 may be exposed in the contact area C/A. As shown in FIG. 3, the exposed side surface of the upper layer 341b of the first auxiliary electrode 341 may be connected to the exposed side surface of the second auxiliary electrode 342. However, the exposed side surface of the upper layer 341b of the first auxiliary electrode 341 may not be connected to the exposed side surface of the second auxiliary electrode 342. The exposed side surface of the upper layer 341b of the first auxiliary electrode 341 may protrude more than the exposed side surface of the second auxiliary electrode 342 or may be caved in.

The upper layer 341b of the first auxiliary electrode 341 may have a higher etching selectivity than that of the lower layer 341a. For example, the etching selectivity of the upper layer 341b of the first auxiliary electrode 341 may be higher than the etching selectivity of the lower layer 341a with respect to the same etchant. For example, the second auxiliary electrode 142 and the upper layer 341b of the first auxiliary electrode 341 may be made of copper, and the lower layer 341b may be made of a molybdenum-titanium (Mo—Ti) alloy. As copper has a higher etching selectivity than that of a molybdenum titanium (Mo—Ti) alloy, the upper layer 341b of the first auxiliary electrode 341 may be etched more rapidly than the lower layer 341a.

As shown in the FIG. 3 example, the cathode 173 may be connected to the exposed top surface of the lower layer 341a of the first auxiliary electrode 341, the exposed side surface of the upper layer 341b of the first auxiliary electrode 341, or the exposed side surface of the second auxiliary electrode 342 in the contact area C/A. In the contact area C/A, the height, that is the distance from the bottom surface of the lower layer 341a of first auxiliary electrode 341 to the bottom surface of the passivation layer 182 (i.e., the sum of the thickness of the first auxiliary electrode 341 and the second auxiliary electrode 342) may be greater than the thickness of the organic light-emitting layer 172. Accordingly, even if the organic light-emitting layer 172 covers the exposed top surface of the lower layer 341a of the first auxiliary electrode 341 in the contact area C/A, the cathode 173 can still be connected to the exposed side surface of the upper layer 341b of the first auxiliary electrode 341, or to the exposed side surface of the second auxiliary electrode 342. Accordingly, the overall resistance of the cathode 173 can be reduced, and a voltage drop across the resistance of the cathode 173 can be reduced.

As shown in the example of FIG. 3, the organic light-emitting display device 300 according to an embodiment may include the first auxiliary electrode 341 including of the upper layer 341b and the lower layer 341a. In this case, the height of the eaves structure, (i.e., the distance from the bottom surface of lower layer 341a of the first auxiliary electrode 341 to the bottom surface of the passivation layer 182) can be additionally obtained. That is, in the contact area C/A, the top surface of the upper layer 341b of the first auxiliary electrode 341 may not be exposed, while the top surface of the lower layer 341a of the first auxiliary electrode 341 may be exposed. Accordingly, more physical space where the cathode 173 is in contact with the auxiliary electrodes can be obtained, so that the cathode 173 can be connected to the first auxiliary electrode 341 or the second auxiliary electrode 342 more stably.

Figure 4:
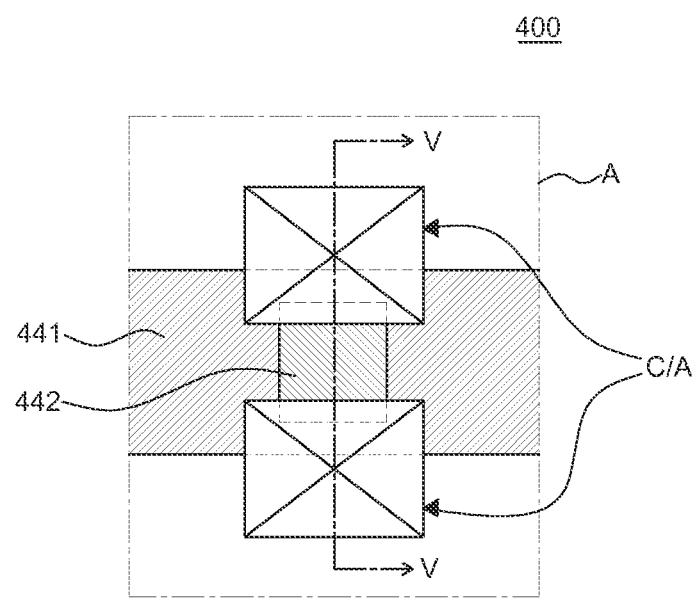
FIG. 4 is an enlarged plan view of a part of an auxiliary electrode member of an organic light-emitting display device according to an embodiment.
Figure 5:
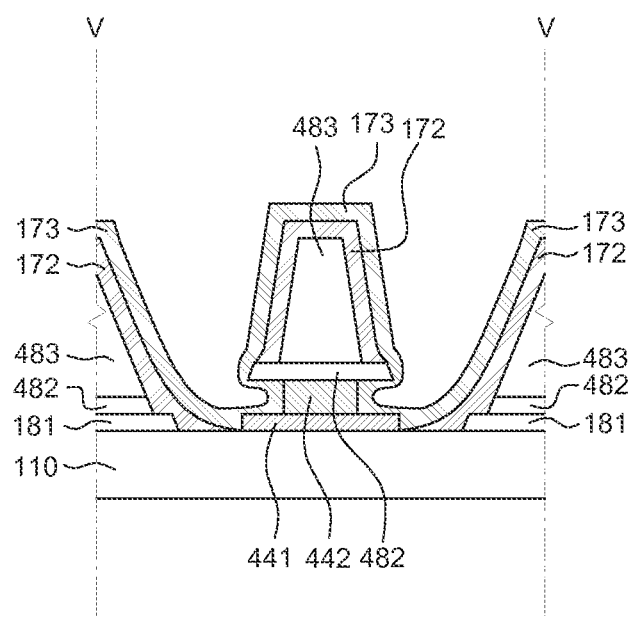
FIG. 5 is a schematic cross-sectional view taken along line V-V' of FIG. 4.

FIG. 4 is an enlarged plan view of a part of an auxiliary electrode member of an organic light-emitting display device according to an embodiment. FIG. 5 is a schematic cross-sectional view taken along line V-V' of FIG. 4. For convenience of description, the region A shown in FIG. 1 is enlarged in FIG. 4. FIG. 5 shows a part of the cross-section of the contact area C/A. The organic light-emitting display device 400 shown in the examples of FIGS. 4 and 5 is substantially identical to the organic light-emitting display device 100 shown in the examples of FIGS. 1 and 2, and redundant description will be omitted.

With reference to the FIG. 4 example, the organic light-emitting display device 400 may include the a passivation layer 482, a second auxiliary electrode 442, and a first auxiliary electrode 441. Therefore, the first auxiliary electrode 441 may be extended in a particular direction. For example, the first auxiliary electrode 441 may be extended in a direction parallel with the gate line 120. However, the extension direction of the first auxiliary electrode 441 is not limited thereto, and the first auxiliary electrode 441 may be extended in a different direction from the gate line 120. In some embodiments, the first auxiliary electrode 441 may be disposed in a mesh pattern. In that case, the same voltage can be applied to the cathode 173 of each of the sub-pixels via the first auxiliary electrodes 441 disposed densely in a mesh pattern. As a result, the problem of non-uniform luminance caused by voltage drop can be drastically reduced.

Both sides of the first auxiliary electrode 441 may be exposed in the contact areas C/A, respectively. For example, as shown in FIG. 4, both sides of the first auxiliary electrode 441 that fall within the contact areas C/A, respectively, may be exposed. Although the contact areas C/A illustrated in the FIG. 4 example have a rectangular shape, the contact areas C/A may have, e.g., a polygonal shape, a circular shape, or an oval shape other than a rectangular shape.

With reference to the FIG. 5 example, the second auxiliary electrode 442 may be disposed closer to the center core of the structure than the first auxiliary electrode 441, so that a side surface of the first auxiliary electrode 441 protrudes more than an exposed side surface of the second auxiliary electrode 442. In other words, the side surface of the first auxiliary electrode 441 may be disposed closer to the inside of the opening of the passivation layer 482 than the side surface of the second auxiliary electrode 442. That is, the top surfaces of the both sides of the first auxiliary electrode 441 may be exposed. The passivation layer 482 may be disposed on the second auxiliary electrode 442, and may have side surfaces protruding more than the exposed side surfaces of the second auxiliary electrode 442. In this case, the bottom surface of the passivation layer 482 may be exposed in the contact area C/A. For example, as illustrated in FIG. 5, the bottom surface of the passivation layer 482 may be exposed in a manner corresponding to the exposed top surface of the first auxiliary electrode 441. Accordingly, a shadow area may be made on the top surface of the first auxiliary electrode 441 by means of the passivation layer 482. A planarization layer 483 may be disposed on the passivation layer 482. That is, the part of the planarization layer 483 in the contact area C/A may be isolated from the rest of the planarization layer 483 in the area other than the contact area C/A, and thus may be disposed in an island shape.

The organic light-emitting layer 172 may not cover the exposed top surface of the first auxiliary electrode 441 and the exposed side surface of the second auxiliary electrode 442 in the contact area C/A. On the other hand, the cathode 173 may cover the exposed top surface of the first auxiliary electrode 441 and the side surface of the second auxiliary electrode 442 in the contact area C/A, and may be formed along the side surface of the passivation layer 482 and the side surface and top surface of the planarization layer 483.

The organic light-emitting display device 400 may include the first auxiliary electrode 441 with both of its sides exposed in the contact area C/A, so that the cathode 173 can be in contact with the exposed top surfaces of both sides of the first auxiliary electrode 441 and the exposed side surfaces of both sides of the second auxiliary electrode 442 in the contact area C/A. As a result, the cathode 173 can be electrically connected to the first auxiliary electrode 441 more stably, and the cathode 173 can receive the voltage VSS more stably. Accordingly, the voltage drop can be further reduced.

Figure 6:
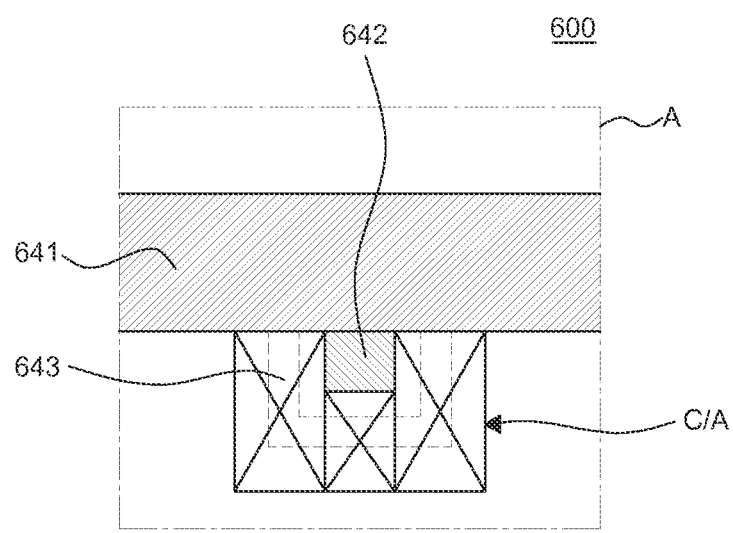
FIG. 6 is an enlarged plan view of a part of an auxiliary electrode member of an organic light-emitting display device according to an embodiment.

FIG. 6 is an enlarged plan view of a part of an auxiliary electrode member of an organic light-emitting display device according to an embodiment. For convenience of description, the region A shown in FIG. 1 is enlarged in FIG. 6. The organic light-emitting display device 600 shown in FIG. 6 is substantially identical to the organic light-emitting display device 100 shown in FIG. 1, and redundant description will be omitted.

With reference to FIG. 6, the organic light-emitting display device 600 may include a first auxiliary electrode 641, which may include an extended portion 643 protruding from one of the outlines of the first auxiliary electrode 641 in the contact area C/A, and a second auxiliary electrode 642. The first auxiliary electrode 641 may be extended in a particular direction. The extended portion 643 may protrude from one of the outlines of the first electrode 641 in the contact area C/A. Although the extended portion 643 shown in the FIG. 6 example may have a rectangular shape, the extended portion 643 may have, e.g., a semi-circular shape or a polygonal shape other than the rectangular shape. A second auxiliary electrode 642 may be disposed on and within the extended portion 643. A part of the top surface of the extended portion 643 may be exposed in the contact area C/A. The passivation layer may cover the second auxiliary electrode 642, and may be disposed on the extended portion 643 in the contact area C/A. Accordingly, the bottom surface of the passivation layer above the exposed top surface of the first auxiliary electrode 641 can be exposed in the contact area C/A.

The organic light-emitting layer may not cover the exposed top surface of the extended portion 643 or the side surface of the second auxiliary electrode 642 in the contact area C/A. On the other hand, the cathode 173 can be in contact with the exposed top surface of the extended portion 643 or the side surface of the second auxiliary electrode 642 in the contact area C/A.

The organic light-emitting display device 600 may include the extended portion 643 protruding from the first auxiliary electrode 641 in the contact area C/A. If the extended portion 643 has a rectangular shape as shown in the FIG. 6 example, the cathode can be in contact with the exposed top surface of the extended portion 643 from any of the three directions. Accordingly, the cathode can be connected to the auxiliary electrode stably, so that the cathode can receive the voltage VSS stably via the auxiliary electrode.

Figure 7:
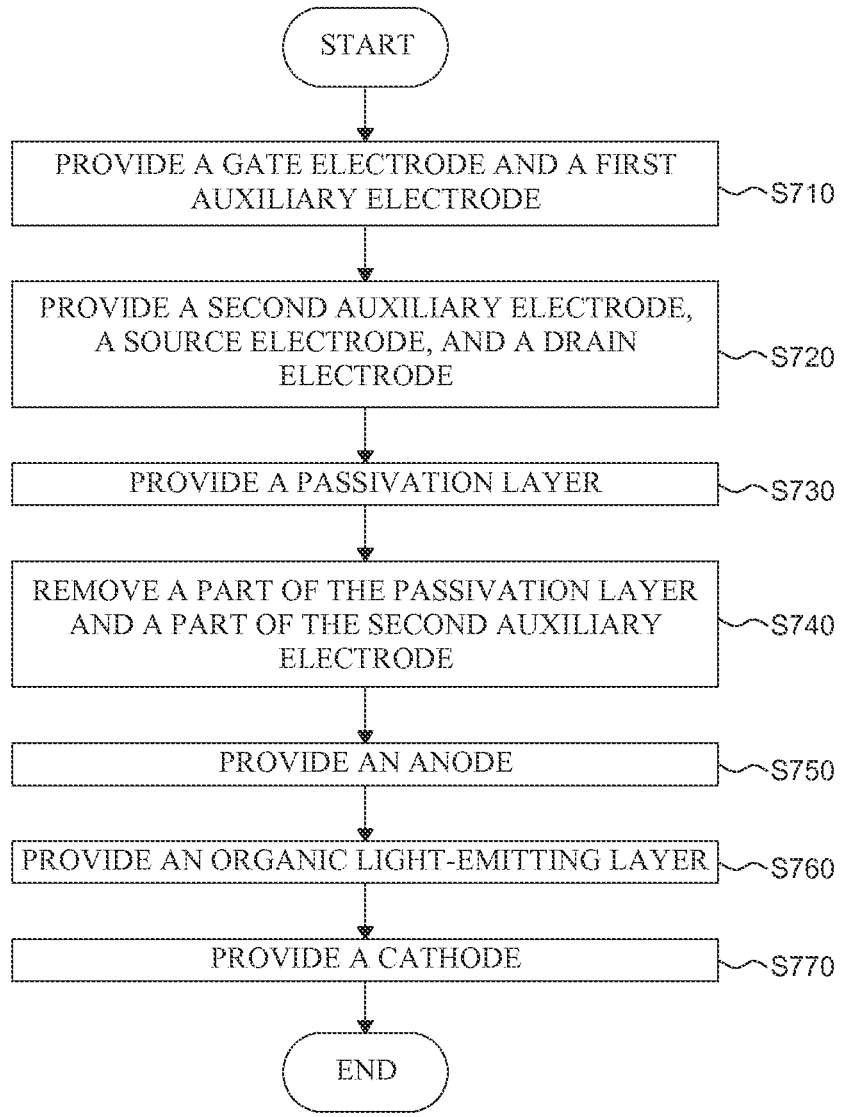
FIG. 7 is a flowchart for illustrating a method of manufacturing an organic light-emitting display device according to an embodiment.

FIG. 7 is a flowchart for illustrating a method of manufacturing an organic light-emitting display device according to an embodiment. FIGS. 8A to 8E are schematic cross-sectional views for illustrating a method of manufacturing an organic light-emitting display device according to an embodiment. The organic light-emitting display device fabricated by a method according to an embodiment is substantially identical to the organic light-emitting display device 100 shown in FIG. 1; therefore, redundant description will be omitted.

Figure 8A:
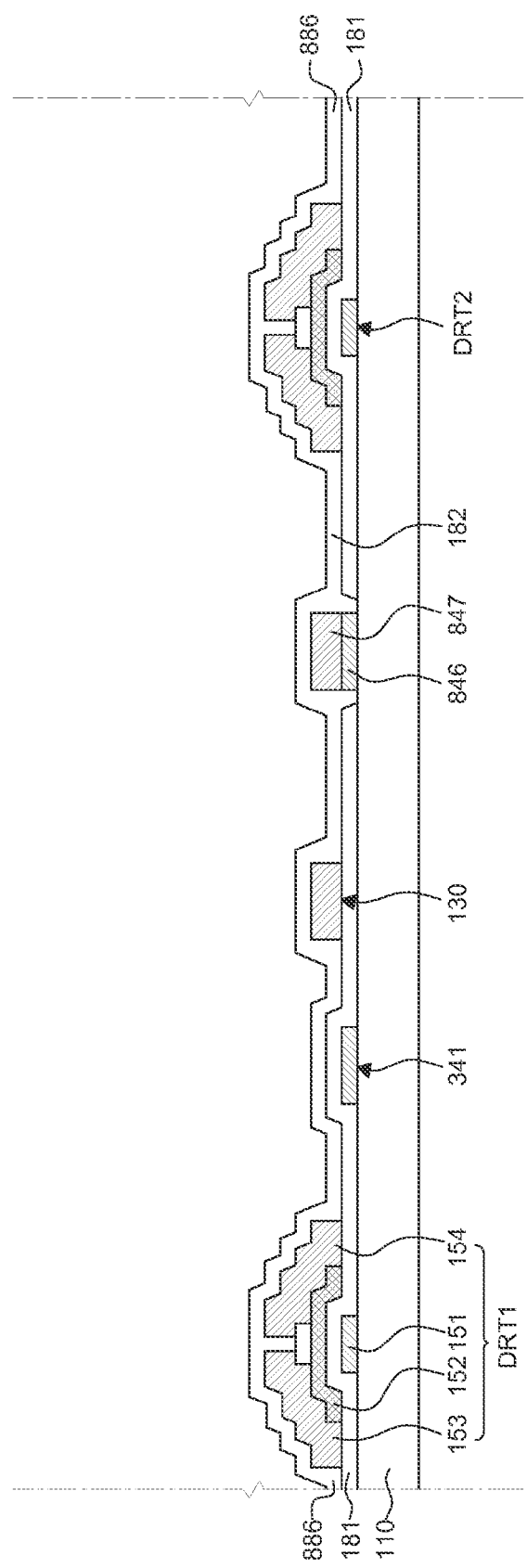
FIGS. 8A to 8E are schematic cross-sectional views for illustrating a method of manufacturing an organic light-emitting display device according to an embodiment.

With reference to FIG. 7, initially, a gate electrode and a first auxiliary electrode separated from each other may be provided (e.g., formed) on a substrate (operation S710). With reference to FIG. 8A, a first conductive layer may be provided on the substrate 110. The first conductive layer may be formed by depositing a molybdenum titanium alloy or a transparent conductive oxide (TCO) on the substrate 110 by a deposition process, such as sputtering and atomic layer deposition (ALD). However, the process to form the first conductive layer is not limited thereto. The first conductive layer may be formed by various processes, such as printing or coating. Then, by patterning the first conductive layer, the gate electrode 151 and the first auxiliary electrode 846, which may be electrically separated, are formed. For example, the gate electrode 151 and the first auxiliary electrode 846 may be formed by performing a photolithography process using a positive photoresist.

Subsequently, a gate insulating layer (e.g., gate insulating layer 181) may be provided such that it covers the gate electrode and exposes a top surface of the first auxiliary electrode. The gate insulating layer 181 may be formed in a manner that an inorganic insulating material is deposited. A photolithography process may be performed for exposing the top surface of the first auxiliary electrode 846.

Subsequently, an active layer (e.g., active layer 152) may be provided on the gate insulating layer such that it is disposed over the gate electrode. The active layer 152 may be formed by forming a silicon (Si) layer on the gate insulating layer 181 and crystallizing it. However, the active layer 152 may be formed by various processes depending on the material of the active layer 152.

Subsequently, a second auxiliary electrode may be provided such that it is in contact with an exposed top surface of the first auxiliary electrode, to form a source electrode and a drain electrode connected to the active layer (operation S720). The source electrode 153, the drain electrode 154, and the second auxiliary electrode 847 may be provided (e.g., formed) together using the second conductive layer. For example, the second conductive layer may be formed such that it covers the active layer 152, the gate insulating layer 181, and the exposed top surface of the first auxiliary electrode 846. The second conductive layer may be formed by depositing a conductive material having a etching selectivity higher than that of the first conductive layer. For example, the second conductive layer may be formed by depositing copper or aluminum by sputtering or by ALD. Then, by patterning the second conductive layer by a photolithography process using a positive photoresist, the source electrode 153, the drain electrode 154 and the second auxiliary electrode 847 may be formed.

Subsequently, a passivation layer may be provided such that it covers the source electrode, the drain electrode, and the top surface of the second auxiliary electrode (operation S730). The passivation layer 886 may be formed by depositing an inorganic material such that it covers the source electrode 153, the drain electrode 154, and the second auxiliary electrode 142. For example, the passivation layer 886 may be formed, e.g., by depositing silicon oxide or silicon nitride by the chemical vapor deposition (CVD), ALD, etc. However, the passivation layer may also be formed by thermal oxidation. The passivation layer 886 may be formed as a single layer or as multiple layers.

Figure 8B:
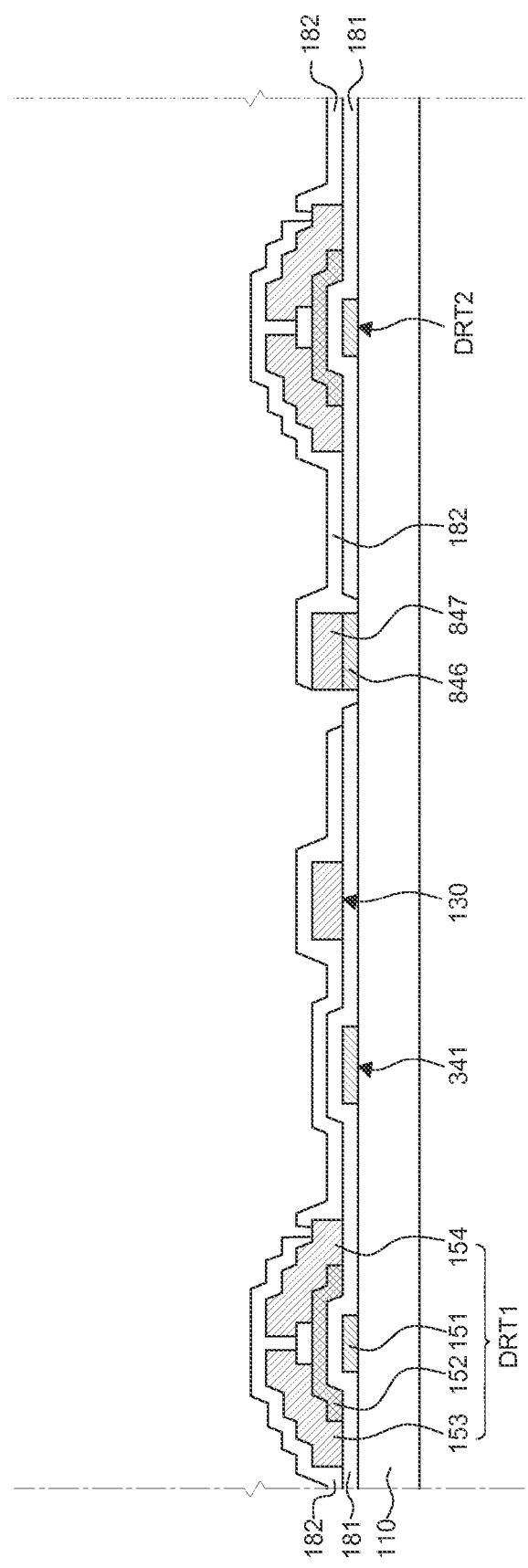

Subsequently, a part of the passivation layer and a part of the second auxiliary electrode may be removed such that a side surface of the second auxiliary electrode and a top surface of the first auxiliary electrode are exposed in a contact area (operation S740). With reference to FIG. 8B, contact holes may be formed such that a drain electrode 154 of a first driving thin-film transistor DRT1 and a drain electrode of a second driving thin-film transistor DRT2 are respectively exposed. An opening may be formed such that a side surface of the second auxiliary electrode 847 is exposed in the contact area. FIG. 8A shows the passivation layer 886 before the contact holes and the opening are formed. FIG. 8B shows the passivation layer 182 after the contact holes and the opening are formed. This is why the passivation layer is denoted by different reference numerals, i.e., as 886 in FIG. 8A and as 182 in FIG. 8B. The contact holes and the opening may be obtained, e.g., by a photolithography process using a positive photoresist. For example, a positive photoresist may be applied onto the passivation layer 886. Then, exposure may be performed using a mask that exposes portions where the contact holes and the opening are to be formed. After the exposure, the photoresist may be developed to form a photoresist pattern. Then, etching may be performed based on the photoresist pattern to thereby form the contact holes and the opening.

Figure 8C:
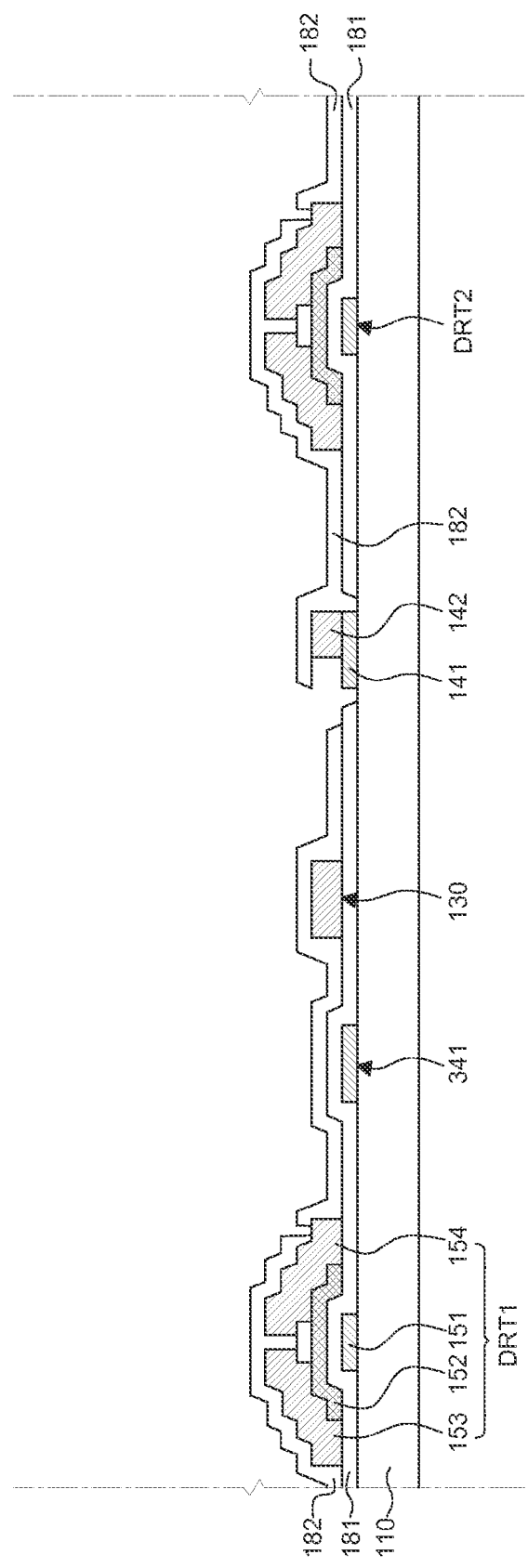

With reference to FIG. 8C, the second auxiliary electrode 142 may be partially removed, such that the top surface of the first auxiliary electrode 141 is exposed. The first auxiliary electrode 141 shown in FIG. 8C has the exposed top surface, in comparison with the first auxiliary electrode 846 shown in FIGS. 8A and 8B. The second auxiliary electrode 142 shown in FIG. 8C has the caved side surface, in comparison with the second auxiliary electrode 847 shown in FIGS. 8A and 8B. This is why the first auxiliary electrode and the second auxiliary electrode are respectively denoted by different reference numerals, i.e., as 846 and 847 in FIGS. 8A and 8B, and as 141 and 142 in FIG. 8C. That is, a part of the second auxiliary electrode 847 shown in FIGS. 8A and 8B may be removed by a etching process, and accordingly the first auxiliary electrode 141 and the second auxiliary electrode 142 shown in FIG. 8C are formed.

The etching process may be performed, e.g., by using an etchant for etching the second auxiliary electrode 142. For example, if the second auxiliary electrode 142 is made of copper, a copper etchant, e.g., mainly of an acid mixture including sulfuric acid ($H_2SO_4$), nitric acid ($HNO_3$), phosphoric acid ($H_3PO_4$), etc., may be used for etching the second auxiliary electrode 142. As described above, because the etching selectivity of the second auxiliary electrode 142 is higher than the etching selectivity of the first auxiliary electrode 141, the second auxiliary electrode 142 can be etched more than the first auxiliary electrode 141. The etching depth of the second auxiliary electrode 142 can be controlled by adjusting the etching time or by adding an additive to the etchant.

During the process of etching the second auxiliary electrode 142, the etchant may flow into the drain electrode 154 of the first driving thin-film transistor DRT1 and the drain electrode of the second driving thin-film transistor DRT2 via the contact holes. To prevent the drain electrode 154 from being damaged, the contact holes may be protected by a positive photoresist. For example, a positive photoresist may be applied onto the contact holes and the opening prior to etching the second auxiliary electrode 142. Subsequently, the positive photoresist may be subjected to an exposure process and then may be developed, such that a part of the positive photoresist corresponding to the opening can be removed. Subsequently, the second auxiliary electrode 142 may be partially etched, and it may be possible to selectively remove only the second auxiliary electrode 142 without causing damage to the drain electrode 154.

Figure 8D:
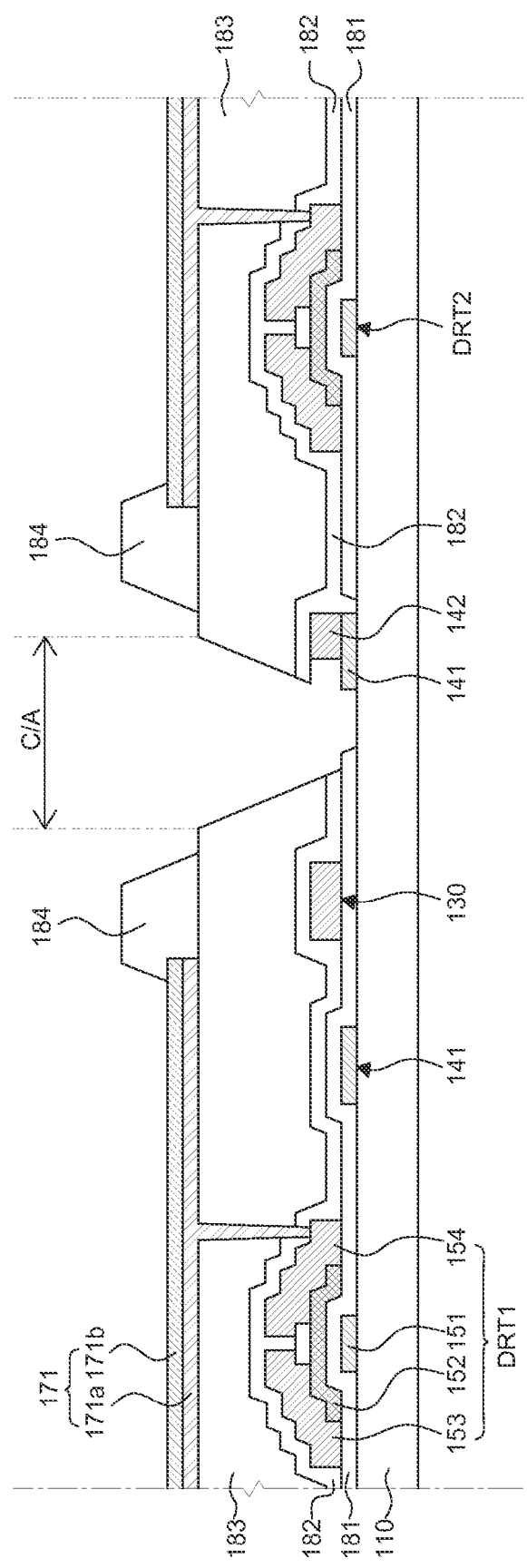

Subsequently, an anode may be provided to be electrically connected to the drain electrode of the first driving thin-film transistor and the drain electrode of the second driving thin-film transistor (operation S750). With reference to FIG. 8D, a planarization layer 183 may be provided on the passivation layer 182. The planarization layer 183 may be made, e.g., of an organic insulating material. Subsequently, a contact hole through which the drain electrode of the first driving thin-film transistor DRT1 is exposed, and a contact hole through which the drain electrode of the second driving thin-film transistor DRT2 is exposed may be formed. Then, an opening may be formed corresponding to a contact area C/A. Subsequently, a reflective layer 171a connected to the first driving thin-film transistor DRT1 and a first transparent electrode 171b may be formed on the planarization layer 183. Each of the reflective layer 171a and the first transparent electrode 171b can be formed by depositing respective materials on the planarization layer and patterning them. Subsequently, a bank 184 may be formed to surround the anode 171 of the first sub-pixel and the anode of the second sub-pixel. For example, the bank 184 may be formed by coating an organic insulating material over the anode 171 and the passivation layer 182, and by patterning the organic insulating material using a mask having openings corresponding to pixel areas of the sub-pixels.

Figure 8E:
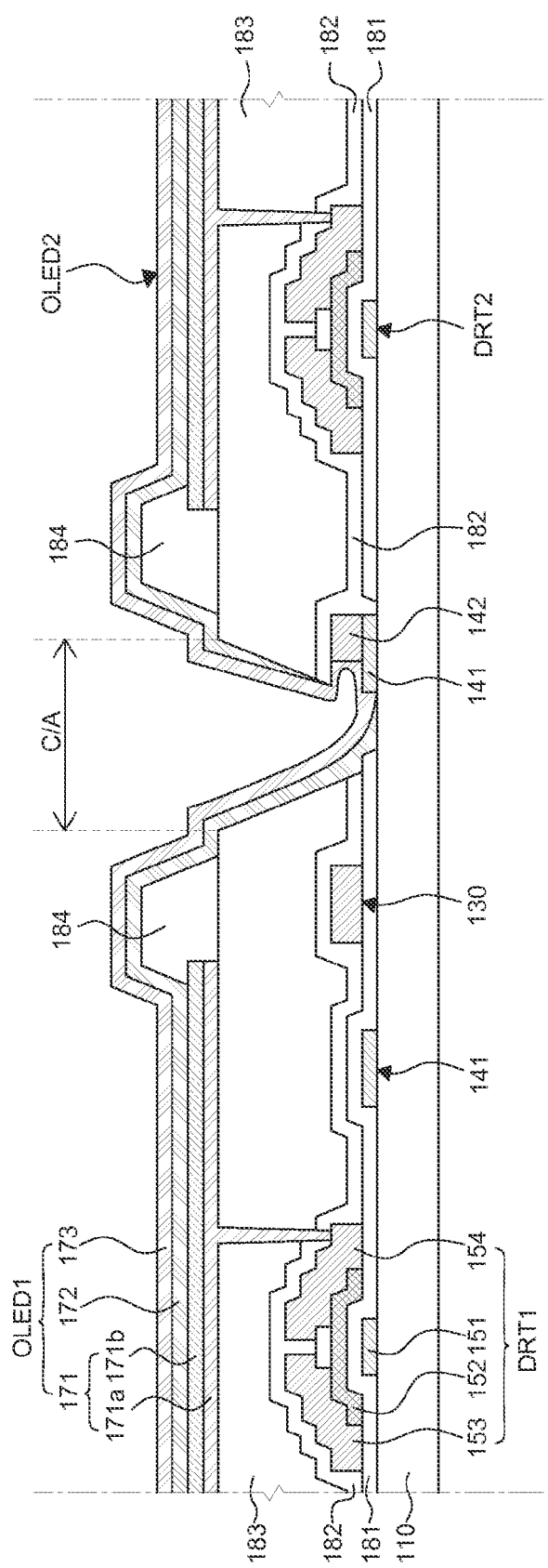

Subsequently, an organic light-emitting layer may be formed on the anode (operation S760). With reference to FIG. 8E, the organic light-emitting layer 172 may be formed on the anode 171 of the first sub-pixel, the anode of the second sub-pixel, the bank 184, and the planarization layer 183. The organic light-emitting layer 172 may be obtained, e.g., by a photoresist process. For example, the organic light-emitting layer 172 may be formed by the photoresist process using a developer, a stripper, and a photoresist pattern made of a substance containing fluorine. However, the manner of forming the organic light-emitting layer 172 is not limited thereto. As further nonlimiting examples, the organic light-emitting layer 172 may be formed by a mask-free process, such as a laser induced thermal imaging (LITI), a laser induced pattern-wise sublimation (LIPS), and soluble printing.

Subsequently, a cathode may be formed on the organic light-emitting layer, such that it comes in contact with a part of the exposed top surface of the first auxiliary electrode or the exposed side surface of the second auxiliary electrode in the contact area (operation S770). With reference to FIG. 8E, if the cathode 173 includes a metal electrode and a second transparent electrode, the metal electrode may be formed on the organic light-emitting layer 172, and the second transparent electrode may be formed to come in contact with the exposed top surface of the first auxiliary electrode 141 and the side surface of the second auxiliary electrode 142 in the contact area C/A. As described above, because the metal electrode is made of a metal material having a low step coverage, the metal electrode may not cover the exposed top surface of the first auxiliary electrode 141 or the side surface of the second auxiliary electrode 142, like the organic light-emitting layer 172. However, because the second transparent electrode may be made of a transparent conductive oxide (TCO) having a high step coverage, the second transparent electrode can come in contact with the exposed top surface of the first auxiliary electrode 141 and the side surface of the second auxiliary electrode 142. Finally, the cathode 173 electrically connected to the auxiliary electrodes may be formed.

As can be seen from the examples illustrated in FIGS. 8A to 8E, no partitioning wall in a reverse-tapered shape is formed in the method of manufacturing an organic light-emitting display device according to an embodiment. Accordingly, a negative photoresist may not be used. As such, a possible damage made to the substrate during a repair process of a negative photoresist can be reduced. Further, the number of discarded substrates can be reduced. Therefore, production yield of organic light-emitting display devices can be improved. In addition, the "eaves structure" for connecting the cathode 173 to the auxiliary electrodes can be formed simultaneously during the process of forming the first driving thin-film transistor DRT1 and the second driving thin-film transistor DRT2. Accordingly, the auxiliary electrodes connected to the cathode 173 can be easily produced. As a result, manufacturing cost of organic light-emitting display devices can be saved.

According to the present disclosure, a cathode may be connected to auxiliary electrodes in an eaves structure, so that the problem of non-uniform luminance caused by voltage drop can be reduced. Further, the auxiliary electrodes in the eaves structure resembling a partitioning wall may be formed without using a negative photoresist, so that production yield can be increased and the problem that the production cost is increased by including a partitioning wall can be reduced. In addition, the auxiliary electrodes may be made of the same material as that of the thin-film transistors and the passivation layer, so that no additional material or no additional process for forming a partitioning wall may be necessary. As a result, the manufacturing process may be simplified.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:
1. An organic light-emitting display device, comprising:
   a thin-film transistor on a substrate;
   an auxiliary electrode member in a contact area on the substrate, the auxiliary electrode member being spaced apart from the thin-film transistor;
   an insulating member on the thin-film transistor and the auxiliary electrode member, the insulating member comprising:
      an opening through which at least a part of the auxiliary electrode member is exposed in the contact area; and
      an exposed bottom surface exposed over the auxiliary electrode member; and
   an organic light-emitting element on the insulating member, the organic light-emitting element comprising:
      an anode;
      an organic light-emitting layer; and
      a cathode,
   wherein a side surface of the opening is closer to the inside of the opening than a side surface of the auxiliary electrode member, such that the cathode is in contact with the auxiliary electrode member without a reverse-tapered partitioning wall thereover.
2. The organic light-emitting display device of claim 1, wherein:
   the auxiliary electrode member comprises an exposed surface not in contact with the organic light-emitting layer in the contact area; and
   the cathode is in contact with the exposed surface of the auxiliary electrode member.
3. The organic light-emitting display device of claim 2, wherein a thickness of the auxiliary electrode member is greater than a thickness of the organic light-emitting layer.
4. The organic light-emitting display device of claim 1, wherein:
   the thin-film transistor comprises:
      a gate electrode;
      an active layer;
      a source electrode; and
      a drain electrode;
   the auxiliary electrode member comprises:
      a first auxiliary electrode; and
      a second auxiliary electrode on the first auxiliary electrode;
   a side surface of the first auxiliary electrode is closer to the inside of the opening than a side surface of the second auxiliary electrode;
   the first auxiliary electrode comprises a same material as that of the gate electrode; and
   the second auxiliary electrode comprises a same material as that of the source electrode or the drain electrode.

5. The organic light-emitting display device of claim 4, wherein the first auxiliary electrode comprises a material having a lower etching selectivity than an etching selectivity of the second auxiliary electrode, with respect to an etchant for etching the second auxiliary electrode.

6. The organic light-emitting diode device of claim 1, wherein the auxiliary electrode member comprises an eaves structure.

7. The organic light-emitting diode device of claim 6, wherein the eaves structure comprises a same material as that of the thin-film transistor and the insulating member.

8. An organic light-emitting display device, comprising:
 a thin-film transistor on a substrate, the thin-film transistor comprising:
  a gate electrode;
  an active layer;
  a source electrode; and
  a drain electrode;
 a first auxiliary electrode spaced apart from the gate electrode, the first auxiliary electrode comprising an exposed top surface in a contact area on the substrate;
 a second auxiliary electrode on the first auxiliary electrode, the second auxiliary electrode comprising an exposed side surface in the contact area;
 a passivation layer on the second auxiliary electrode, the passivation layer comprising an exposed bottom surface in the contact area;
 an anode electrically connected to the thin-film transistor;
 an organic light-emitting layer on the anode; and
 a cathode on the organic light-emitting layer,
 wherein the cathode is in contact with the exposed top surface of the first auxiliary electrode or the exposed side surface of the second auxiliary electrode in the contact area.

9. The organic light-emitting display device of claim 8, wherein a side surface of the first auxiliary electrode protrudes more than the exposed side surface of the second auxiliary electrode.

10. The organic light-emitting display device of claim 9, wherein the first auxiliary electrode comprises a material having a lower etching selectivity than an etching selectivity of the second auxiliary electrode, with respect to an etchant for etching the second auxiliary electrode.

11. The organic light-emitting display device of claim 8, wherein a distance from a bottom surface of the first auxiliary electrode to the exposed bottom surface of the passivation layer is greater than a thickness of the organic light-emitting layer.

12. The organic light-emitting display device of claim 8, wherein:
 the first auxiliary electrode comprises a same material as that of the gate electrode; and
 the second auxiliary electrode comprises a same material as that of the source electrode or the drain electrode.

13. The organic light-emitting display device of claim 12, wherein:
 the first auxiliary electrode comprises:
  a lower layer comprising an exposed top surface in the contact area; and
  an upper layer comprising an exposed side surface in the contact area; and
 a side surface of the lower layer protrudes more than the exposed side surface of the upper layer in the contact area.

14. The organic light-emitting display device of claim 8, wherein a same voltage is applied to the cathode, the first auxiliary electrode, and the second auxiliary electrode.

15. The organic light-emitting display device of claim 8, wherein:
 the first auxiliary electrode is extended in a particular direction;
 a part of a top surface of both sides of the first auxiliary electrode is exposed in the contact area; and
 a side surface of the first auxiliary electrode protrudes more than the exposed side surface of the second auxiliary electrode in the contact area.

16. The organic light-emitting display device of claim 8, wherein:
 the first auxiliary electrode is extended in a particular direction;
 the first auxiliary electrode comprises an extended portion protruding from the first auxiliary electrode in the contact area;
 the second auxiliary electrode is disposed within the extended portion; and
 a part of the top surface of the extended portion of the first auxiliary electrode is exposed in the contact area.

17. The organic light-emitting display device of claim 8, wherein:
 the anode comprises:
  a reflective layer; and
  a first transparent electrode on the reflective layer;
 the cathode comprises:
  a metal electrode; and
  a second transparent electrode on the metal electrode; and
 the second transparent electrode of the cathode is in contact with the exposed top surface of the first auxiliary electrode or the exposed side surface of the second auxiliary electrode in the contact area.

* * * * *